(12) United States Patent
Wieting

(10) Patent No.: US 8,084,291 B2
(45) Date of Patent: Dec. 27, 2011

(54) THERMAL MANAGEMENT AND METHOD FOR LARGE SCALE PROCESSING OF CIS AND/OR CIGS BASED THIN FILMS OVERLYING GLASS SUBSTRATES

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 12/953,725

(22) Filed: Nov. 24, 2010

(65) Prior Publication Data

US 2011/0070688 A1  Mar. 24, 2011

Related U.S. Application Data

(62) Division of application No. 12/568,641, filed on Sep. 28, 2009, now Pat. No. 7,910,399.

(60) Provisional application No. 61/101,567, filed on Sep. 30, 2008.

(51) Int. Cl.
   *H01L 21/00* (2006.01)
   *H01L 31/00* (2006.01)
(52) U.S. Cl. ...... 438/96; 438/64; 136/265; 257/E21.001
(58) Field of Classification Search .................. 438/96, 438/95, 93, 64, 61; 136/262, 264, 265; 257/E21.001, E31.001
See application file for complete search history.

(56) References Cited

U.S. PATENT DOCUMENTS

| | | |
|---|---|---|
| 3,520,732 A | 7/1970 | Nakayama et al. |
| 3,975,211 A | 8/1976 | Shirland |
| 4,062,038 A | 12/1977 | Cuomo et al. |

(Continued)

FOREIGN PATENT DOCUMENTS

AU   19987865198 B2   2/1999

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V.; Thin Solid Films 413 (2002) pp. 92-97.

(Continued)

*Primary Examiner* — Walter L Lindsay, Jr.
(74) *Attorney, Agent, or Firm* — Kilpatrick Townsend & Stockton LLP

(57) ABSTRACT

The thermal management and method for large scale processing of CIS and/or CIGS based thin film overlaying glass substrates. According to an embodiment, the present invention provides a method for fabricating a copper indium diselenide semiconductor film. The method includes providing a plurality of substrates, each of the substrates having a copper and indium composite structure. The method also includes transferring the plurality of substrates into a furnace, each of the plurality of substrates provided in a vertical orientation with respect to a direction of gravity, the plurality of substrates being defined by a number N, where N is greater than 5. The method further includes introducing a gaseous species including a selenide species and a carrier gas into the furnace and transferring thermal energy into the furnace to increase a temperature from a first temperature to a second temperature, the second temperature ranging from about 350° C. to about 450° C. to at least initiate formation of a copper indium diselenide film from the copper and indium composite structure on each of the substrates.

20 Claims, 11 Drawing Sheets

U.S. PATENT DOCUMENTS

| | | |
|---|---|---|
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,445,847 A | 8/1995 | Wada |
| 5,474,939 A | 12/1995 | Pollock et al. |
| 5,501,744 A * | 3/1996 | Albright et al. ............... 136/258 |
| 5,512,107 A | 4/1996 | Van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,868,869 A | 2/1999 | Albright et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 * | 10/2003 | Huang et al. ..................... 427/74 |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 * | 2/2007 | Ramanathan et al. .......... 438/95 |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 * | 10/2008 | Zwaap et al. ............... 427/248.1 |
| 7,544,884 B2 * | 6/2009 | Hollars ........................ 136/256 |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,026,122 B1 | 9/2011 | Lee |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 * | 5/2005 | Hollars ........................ 136/265 |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0130890 A1 | 6/2006 | Hantschel et al. |
| 2006/0160261 A1 | 7/2006 | Sheats et al. |
| 2006/0174932 A1 | 8/2006 | Usui et al. |
| 2006/0219288 A1 | 10/2006 | Tuttle |
| 2006/0219547 A1 | 10/2006 | Tuttle |

| | | | |
|---|---|---|---|
| 2006/0220059 A1 | 10/2006 | Satoh et al. | |
| 2006/0249202 A1 | 11/2006 | Yoo et al. | |
| 2006/0267054 A1 | 11/2006 | Martin et al. | |
| 2007/0006914 A1 | 1/2007 | Lee | |
| 2007/0089782 A1 | 4/2007 | Scheuten et al. | |
| 2007/0116892 A1* | 5/2007 | Zwaap et al. | 427/587 |
| 2007/0116893 A1 | 5/2007 | Zwaap et al. | |
| 2007/0151596 A1 | 7/2007 | Nasuno et al. | |
| 2007/0163643 A1 | 7/2007 | Van Duren et al. | |
| 2007/0169810 A1 | 7/2007 | Van Duren | |
| 2007/0193623 A1 | 8/2007 | Krasnov | |
| 2007/0209700 A1 | 9/2007 | Yonezawa et al. | |
| 2007/0264488 A1 | 11/2007 | Lee | |
| 2007/0283998 A1 | 12/2007 | Kuriyagawa et al. | |
| 2007/0289624 A1 | 12/2007 | Kuriyagawa et al. | |
| 2008/0032044 A1 | 2/2008 | Kuriyagawa et al. | |
| 2008/0041446 A1 | 2/2008 | Wu et al. | |
| 2008/0057616 A1 | 3/2008 | Robinson et al. | |
| 2008/0092945 A1 | 4/2008 | Munteanu et al. | |
| 2008/0092953 A1 | 4/2008 | Lee | |
| 2008/0092954 A1 | 4/2008 | Choi | |
| 2008/0105294 A1 | 5/2008 | Kushiya et al. | |
| 2008/0110491 A1 | 5/2008 | Buller et al. | |
| 2008/0110495 A1 | 5/2008 | Onodera et al. | |
| 2008/0121264 A1 | 5/2008 | Chen et al. | |
| 2008/0121277 A1 | 5/2008 | Robinson et al. | |
| 2008/0210303 A1 | 9/2008 | Lu et al. | |
| 2008/0280030 A1 | 11/2008 | Van Duren et al. | |
| 2009/0021157 A1 | 1/2009 | Kim et al. | |
| 2009/0087940 A1 | 4/2009 | Kushiya | |
| 2009/0087942 A1* | 4/2009 | Meyers | 438/96 |
| 2009/0145746 A1* | 6/2009 | Hollars | 204/192.25 |
| 2009/0217969 A1 | 9/2009 | Matsushima et al. | |
| 2009/0234987 A1* | 9/2009 | Lee et al. | 710/39 |
| 2009/0235983 A1* | 9/2009 | Girt et al. | 136/258 |
| 2009/0235987 A1* | 9/2009 | Akhtar et al. | 136/262 |
| 2009/0293945 A1* | 12/2009 | Peter | 136/255 |
| 2010/0081230 A1 | 4/2010 | Lee | |
| 2010/0087016 A1* | 4/2010 | Britt et al. | 438/7 |
| 2010/0087026 A1* | 4/2010 | Winkeler et al. | 438/61 |
| 2010/0096007 A1* | 4/2010 | Mattmann et al. | 136/256 |
| 2010/0101648 A1* | 4/2010 | Morooka et al. | 136/261 |
| 2010/0101649 A1* | 4/2010 | Huignard et al. | 136/261 |
| 2010/0122726 A1 | 5/2010 | Lee | |
| 2010/0197051 A1 | 8/2010 | Schlezinger et al. | |
| 2010/0210064 A1 | 8/2010 | Hakuma et al. | |
| 2010/0267190 A1 | 10/2010 | Hakuma et al. | |
| 2011/0070682 A1 | 3/2011 | Wieting | |
| 2011/0070683 A1 | 3/2011 | Wieting | |
| 2011/0070684 A1 | 3/2011 | Wieting | |
| 2011/0070685 A1 | 3/2011 | Wieting | |
| 2011/0070686 A1 | 3/2011 | Wieting | |
| 2011/0070687 A1 | 3/2011 | Wieting | |
| 2011/0070690 A1* | 3/2011 | Wieting | 438/102 |
| 2011/0073181 A1 | 3/2011 | Wieting | |
| 2011/0080690 A1 | 4/2011 | Ning et al. | |

FOREIGN PATENT DOCUMENTS

| | | |
|---|---|---|
| AU | 200140599 A1 | 8/2001 |
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000-173969 | 6/2000 |
| JP | 2000-219512 | 8/2000 |
| JP | 2002-167695 | 6/2002 |
| JP | 2002-270871 | 9/2002 |
| JP | 2002-299670 | 10/2002 |
| JP | 2004-332043 | 11/2004 |
| JP | 2005-311292 | 11/2005 |
| WO | WO 01/57932 A1 | 8/2001 |
| WO | WO 2005/011002 | 2/2005 |
| WO | WO 2006/126598 A1 | 11/2006 |
| WO | WO 2007/022221 A2 | 2/2007 |
| WO | WO 2007/077171 A2 | 7/2007 |
| WO | WO 2008/025326 A2 | 3/2008 |

OTHER PUBLICATIONS

Onuma et al., Preparation and Characterization of CuInS2 Thin Films Solar Cells with Large Grain, Elsevier Science B.V; Solar Energy Materials & Solar Cells 69 (2001) pp. 261-269.
International Search Report and Written Opinion for PCT Application No. PCT/US2009/46802, mailed on Jul. 31, 2009, 11 pages.
International Search Report & Written Opinion for PCT Application No. PCT/US2009/46161, mailed on Jul. 27, 2009, 14 pages.
Baumann, A., et al., Photovoltaic Technology Review, presentation Dec. 6, 2004, 18 pages.
Chopra, K.L., et al., "Thin-Film Solar Cells: An Overview", Progress in Photovoltaics: Research and Applications, 2004, vol. 12, pp. 69-92.
Guillen, C., "CuInS$_2$ Thin Films Grown Sequentially from Binary Sulfides as Compared to Layers Evaporated Directly from the Elements", Semiconductor Science and Technology, vol. 21, May 2006, pp. 709-712.
Huang, J. et al., "Photoluminescence and Electroluminescence of ZnS:Cu Nanocrystals in Polymeric Networks", Applied Physics Letters, vol. 70, No. 18, May 5, 1997, pp. 2335-2337.
Huang, J. et al., "Preparation of $Zn_xCd_{1-x}S$ Nanocomposites in Polymer Matrices and Their Photophysical Properties", Langmuir, 1998, vol. 14, pp. 4342-4344.
International Solar Electric Technology, Inc. (ISET) "Thin Film CIGS", Retrieved from http://www.isetinc.com/cigs.html on Oct. 1, 2008, 4 pages.
Kapur et al., "Fabrication of CIGS Solar Cells via Printing of Nanoparticle Precursor Inks", DOE Solar Program Review Meeting 2004, DOE/GO-102005-2067, pp. 135-136.
Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.
Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.
Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.
Kapur et al., "Fabrication of Light Weight Flexible CIGS Solar Cells for Space Power Applications", Materials Research Society, Proceedings, vol. 668, 2001, pp. H3.5.1-H3.5.6.
Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.
Metha et al., "A Graded Diameter and Oriented Nanorod-Thin Film Structure for Solar Cell Application: A Device Proposal", Solar Energy Materials & Solar Cells, 2005, vol. 85, pp. 107-113.
Srikant V., et al., "On the Optical Band Gap of Zinc Oxide", Journal of Applied Physics, vol. 83, No. 10, May 15, 1998, pp. 5447-5451.
Yang, Y., et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.
Yang, Y., et al., "Preparation, Characterization and Electroluminescence of ZnS Nanocrystals in a Polymer Matrix", Journal Material Chem., 1997, vol. 7, No. 1, pp. 131-133.
Yang et al., "Electroluminescence from ZnS/CdS Nanocrystals/Polymer Composite", Synthetic Metals, 1997, vol. 91, pp. 347-349.
International Search Report and Written Opinion for PCT Application No. PCT/US2009/058829 mailed on Mar. 11, 2011, 12 pages.
International Search Report and Written Opinion for PCT Application No. PCT/US2009/065351, mailed on Jan. 26, 2010, 13 pages.
International Search Report and Written Opinion for PCT Application No. PCT/US09/59097, mailed on Dec. 23, 2009, 12 pages.
International Search Report and Written Opinion for PCT Application No. PCT/US09/59095, mailed on Dec. 4, 2009, 12 pages.
International Search Report and Written Opinion for PCT Application No. PCT/US08/77965, mailed on Dec. 9, 2008, 8 pages.
International Search Report and Written Opinion for PCT Application No. PCT/US08/78019 mailed on Dec. 8, 2008, 9 pages.

Final Office Action of May 31, 2011 for U.S. Appl. No. 12/621,489, 13 pages.
Notice of Allowance of May 25, 2011 for U.S. Appl. No. 12/566,651, 8 pages.
Non-Final Office Action of May 2, 2011 for U.S. Appl. No. 12/953,729, 9 pages.
Non-Final Office Action of May 2, 2011 for U.S. Appl. No. 12/953,721, 9 pages.
Non-Final Office Action of May 2, 2011 for U.S. Appl. No. 12/953,716, 9 pages
Non-Final Office Action of May 2, 2011 for U.S. Appl. No. 12/953,708, 9 pages.
Non-Final Office Action of May 2, 2011 for U.S. Appl. No. 12/953,701, 9 pages.
Non-Final Office Action of Apr. 28, 2011 for U.S. Appl. No. 12/237,369, 17 pages.
Notice of Allowance of Apr. 27, 2011 for U.S. Appl. No. 12/564,886, 11 pages.
Notice of Allowance of Apr. 26, 2011 for U.S. Appl. No. 12/564,046, 11 pages.
Notice of Allowance of Apr. 25, 2011 for U.S. Appl. No. 12/563,065, 11 pages.
Notice of Allowance of Apr. 19, 2011 for U.S. Appl. No. 12/567,715, 11 pages.
Notice of Allowance of Apr. 8, 2011 for U.S. Appl. No. 12/953,697, 11 pages.
Notice of Allowance of Apr. 5, 2011 for U.S. Appl. No. 12/953,679, 11 pages.
Notice of Allowance of Apr. 5, 2011 for U.S. Appl. No. 12/953,674, 11 pages.
Final Office Action of Dec. 27, 2010 for U.S. Appl. No. 12/479,409, 26 pages.
Non-Final Office Action of Dec. 17, 2010 for U.S. Appl. No. 12/577,132, 11 pages.
Notice of Allowance of Dec. 14, 2010 for U.S. Appl. No. 12/558,117, 8 pages.
Notice of Allowance of Oct. 21, 2010 for U.S. Appl. No. 12/565,735, 4 pages.
Non-Final Office Action of Sep. 28, 2010 for U.S. Appl. No. 12/237,371, 15 pages.
Non-Final Office Action of Sep. 22, 2010 for U.S. Appl. No. 12/621,489, 23 pages.
Notice of Allowance of Aug. 27, 2010 for U.S. Appl. No. 12/509,136, 8 pages.
Non-Final Office Action of Aug. 18, 2010 for U.S. Appl. No. 12/237,369, 17 pages.
Non-Final Office Action of Aug. 5, 2010 for U.S. Appl. No. 12/565,735, 14 pages.
Non-Final Office Action of Jul. 22, 2010 for U.S. Appl. No. 12/479,409, 21 pages.
Non-Final Office Action of May 27, 2010 for U.S. Appl. No. 12/568,641, 10 pages.
Non-Final Office Action of Oct. 12, 2011 for U.S. Appl. No. 13/196,830, 8 pages.
Non-Final Office Action of Oct. 6, 2011 for U.S. Appl. No. 13/196,827, 9 pages.
Non-Final Office Action of Oct. 6, 2011 for U.S. Appl. No. 13/190,856, 7 pages.
Non-Final Office Action of Oct. 6, 2011 for U.S. Appl. No. 13/196,825, 8 pages.
Non-Final Office Action of Sep. 15, 2011 for U.S. Appl. No. 12/237,377, 18 pages.
Non-Final Office Action of Sep. 7, 2011 for U.S. Appl. No. 12/237,369, 21 pages.
Notice of Allowance of Sep. 2, 2011 for U.S. Appl. No. 12/953,721, 20 pages.
Notice of Allowance of Aug. 25, 2011 for U.S. Appl. No. 12/953,729, 19 pages.
Non-Final Office Action of Aug. 4, 2011 for U.S. Appl. No. 12/479,409, 39 pages.
Notice of Allowance of Aug. 2, 2011 for U.S. Appl. No. 12/953,716, 18 pages.
Notice of Allowance of Aug. 1, 2011 for U.S. Appl. No. 12/577,132, 34 pages.
Notice of Allowance of Aug. 1, 2011 for U.S. Appl. No. 12/953,701, 18 pages.
Notice of Allowance of Aug. 1, 2011 for U.S. Appl. No. 12/953,708, 17 pages.

* cited by examiner

THERMAL MANAGEMENT AND METHOD FOR LARGE SCALE PROCESSING OF CIS AND/OR CIGS BASED THIN FILMS OVERLYING GLASS SUBSTRATES

CROSS-REFERENCES TO RELATED APPLICATIONS

This application is a division of U.S. patent application Ser. No. 12/568,641 filed on Sep. 28, 2009, which claims priority to U.S. Provisional Patent Application No. 61/101,567, filed Sep. 30, 2008, entitled "THERMAL MANAGEMENT AND METHOD FOR LARGE SCALE PROCESSING OF CIS AND/OR CIGS BASED THIN FILMS OVERLYING GLASS SUBSTRATES", the disclosures of which are incorporated by reference herein in their entirety for all purposes.

BACKGROUND OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

In the process of manufacturing CIS and/or CIGS types of thin films, there are various manufacturing challenges, such as maintaining structure integrity of substrate materials, ensuring uniformity and granularity of the thin film material, etc. While conventional techniques in the past have addressed some of these issues, they are often inadequate in various situations. Therefore, it is desirable to have improved systems and method for manufacturing thin film photovoltaic devices.

BRIEF SUMMARY OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

According to an embodiment, the present invention provides a method for fabricating a copper indium diselenide semiconductor film. The method includes providing a plurality of substrates, each of the substrates having a copper and indium composite structure. The method also includes transferring the plurality of substrates into a furnace, each of the plurality of substrates provided in a vertical orientation with respect to a direction of gravity, the plurality of substrates being defined by a number N, where N is greater than 5. The method further includes introducing a gaseous species including a selenide species and a carrier gas into the furnace and transferring thermal energy into the furnace to increase a temperature from a first temperature to a second temperature, the second temperature ranging from about 350° C. to about 450° C. to at least initiate formation of a copper indium diselenide film from the copper and indium composite structure on each of the substrates. The method additionally includes maintaining the temperature at about the second temperature for a period of time. The method also includes removing at least the residual selenide species from the furnace. The method further includes introducing a sulfide species into the furnace. The method also includes increasing a temperature to a third temperature, the third temperature ranging from about 500 to 525° C. while the plurality of substrates are maintained in an environment including a sulfur species to extract out one or more selenium species from the copper indium diselenide film.

It is to be appreciated that the present invention provides numerous benefits over conventional techniques. Among other things, the systems and processes of the present invention are compatible with conventional systems, which allow cost effective implementation. In various embodiments, the temperature control method maintains structure integrity of substrates while providing allows various reactions to occur. There are other benefits as well.

DETAILED DESCRIPTION OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

Figure 1:
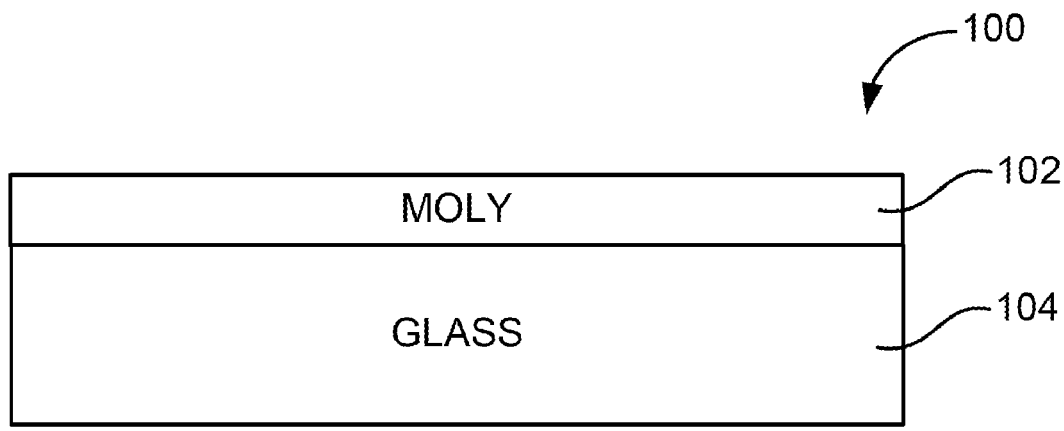
FIG. 1 is a simplified diagram of a transparent substrate with an overlying electrode layer according to an embodiment of the present invention.

FIG. 1 is a simplified diagram of a transparent substrate with an overlying electrode layer according to an embodiment of the present invention. This diagram is merely an example, which should not limit the scope of the claims herein. As shown, structure 100 includes a transparent substrate 104. In an embodiment, substrate 104 can be a glass substrate, for example, a soda lime glass. However, other types of substrates can also be used. Examples of substrates include borosilicate glass, acrylic glass, sugar glass, specialty Corning™ glass, and others. As shown, a contact layer comprising a metal electrode layer 102 is deposited upon substrate 104. According to an embodiment, the metal electrode layer 102 comprises metal material that is characterized by a predetermined conductivity that is optimized for thin-film based solar cell applications. Depending on the application, the metal electrode layer 102 may be deposited in various ways. For example, the metal electrode layer 102 comprises primarily a film of molybdenum that is deposited by sputtering. For example, the thickness of the electrode layer 102 may range form 200 to 700 μm. A sputtering apparatus, such as a DC magnetron sputtering apparatus, can be used to deposit a thin film of materials upon a substrate. Such apparatus is well known and commercially available. But it is to be understood that other types of equipments and/or processes, such as evaporation in vacuum based environment may be used as well. As an example, the sputtering deposition process is described below.

Sputter deposition is a physical vapor deposition (PVD) method of depositing thin films by sputtering, or ejecting, material from a "target", or source, which then deposits onto a substrate, such as a silicon wafer or glass. Sputtered atoms ejected from the target have a wide energy distribution, typically up to 10's of eV's (100000 K). The entire range from high-energy ballistic impact to low-energy thermalized motion is accessible by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon are used. Reactive gases can also be used to sputter compounds. The compound can be formed on the target surface, in-flight or on the substrate depending on the process parameters. The availability of many parameters that control sputter deposition make it a complex process, but also allow experts a large degree of control over the growth and microstructure of the film.

Figure 2:
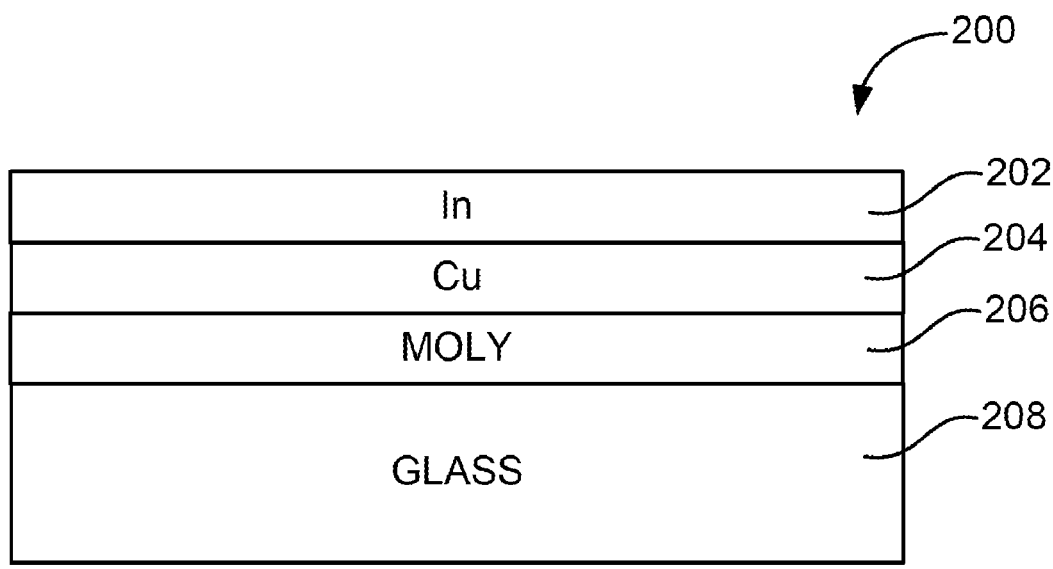
FIGS. 2 and 2A are simplified diagram of a composite structure including a copper and indium film according to an embodiment of the present invention.

FIG. 2 is a simplified diagram of a composite structure including copper and indium material according to an embodiment of the present invention. This diagram is merely an example, which should not limit the scope of the claims herein. In this embodiment, structure 200 is includes a glass substrate 208, preferably soda lime glass, which is about 1 to 3 millimeters thick. For example, the glass substrate 208 serves as a supporting layer. The metal layer 206 is deposited upon substrate 208. For example, the metal layer 206 serves as a metal electrode layer to provide electrical contact. For example, the layer 206 comprises primarily a film of molybdenum which has been deposited by sputtering to a thickness of from 200 to 700 nm. In a specific embodiment, an initial film of chromium is first deposited upon glass 208. For example, the chromium is used to insure good adhesion of the overall structure to the substrate 208. Other types of material may also be used in a barrier layer, such as silicon dioxide, silicon nitride, etc. Layers 204 and 202 include primarily a copper layer and an indium layer deposited upon metal layer 206 by a sputtering process. As shown in FIG. 2, the indium layer overlays the copper layer. But it is to be understood that other arrangements are possible. In another embodiment, the copper layer overlays the indium layer. As an example, a sputtering apparatus, such as a DC magnetron sputtering apparatus, is used to deposit the thin film (e.g., layer 202, 204, and/or 206) of materials upon a substrate. It is to be appreciated that various types of sputtering apparatus may be used. Such apparatus is well known and commercially available. Other material can also be used. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material. According to an embodiment, the ratio between the copper and indium+gallium material is less than 1 (e.g., Cu/III<0.92~0.96, here III means group III); that is, less than one part of copper per one part of indium material.

Figure 2A:
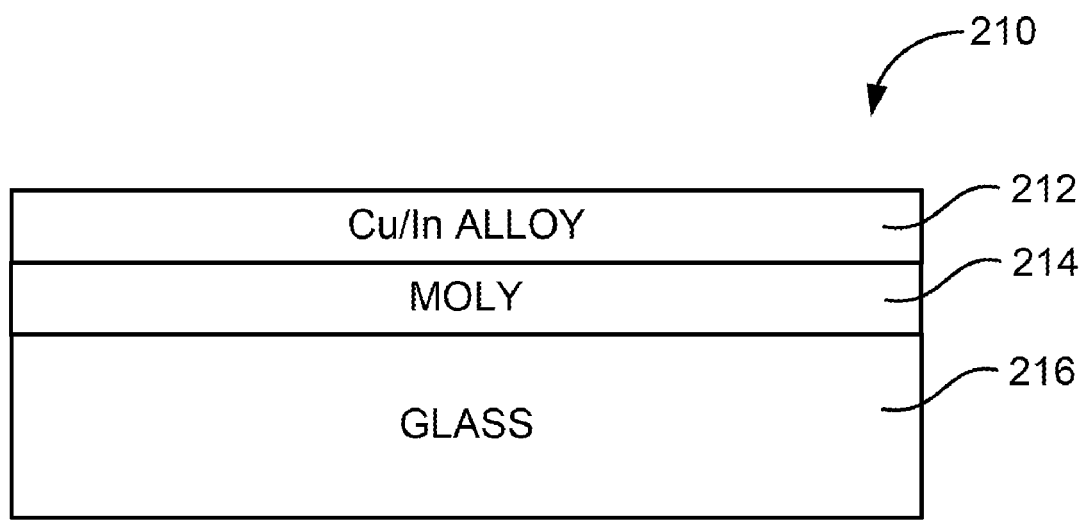

As an example, the structure 200 is formed by processing the structure 100. For example, the Cu and In are deposited onto the structure 100 to form the structure 200. As described, sputtering process is used for forming the copper and/or indium layer. In the embodiment illustrated in FIG. 2, the Cu film and the In film are shown as two separate layers. In another embodiment, a Cu/In composite or Cu/In alloy is formed during the sputtering process, as shown in FIG. 2A. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material FIG. 2A is a simplified diagram of a composite structure 210 including a copper and indium composite film according to another embodiment of the present invention. This diagram is merely an example, which should not limit the scope of the claims herein. As shown, the structure 210 includes a transparent substrate 216. In an embodiment, substrate 216 can be a glass substrate, for example, a soda lime glass. A back contact comprises a metal electrode layer 214 is deposited upon substrate 216. For example, the layer 214 comprises primarily a film of molybdenum material is deposited by sputtering. In a specific embodiment, an initial film of chromium is deposited upon glass 216 before depositing the molybdenum material to provide for good adhesion of the overall structure to the substrate 210. The layer 212 comprises primarily a copper (and gallium) indium alloy or copper (gallium) indium composite material. For example, the mixing or alloying of copper indium results in an improved homogeneity or advantageous morphology of the composite copper and indium film. This improved structure is carried over into the desired CIS film after the selenization step. According to an embodiment, a copper (or CuGa alloy) indium alloy material is formed from separate layers of copper (or CuGa alloy) material and indium material, which diffuse into each layer. For example, the process of forming of copper indium (or CuInGa) alloy material is performed by subjecting the structure to a high temperature annealing in an environment containing gaseous selenium species.

Figure 3:
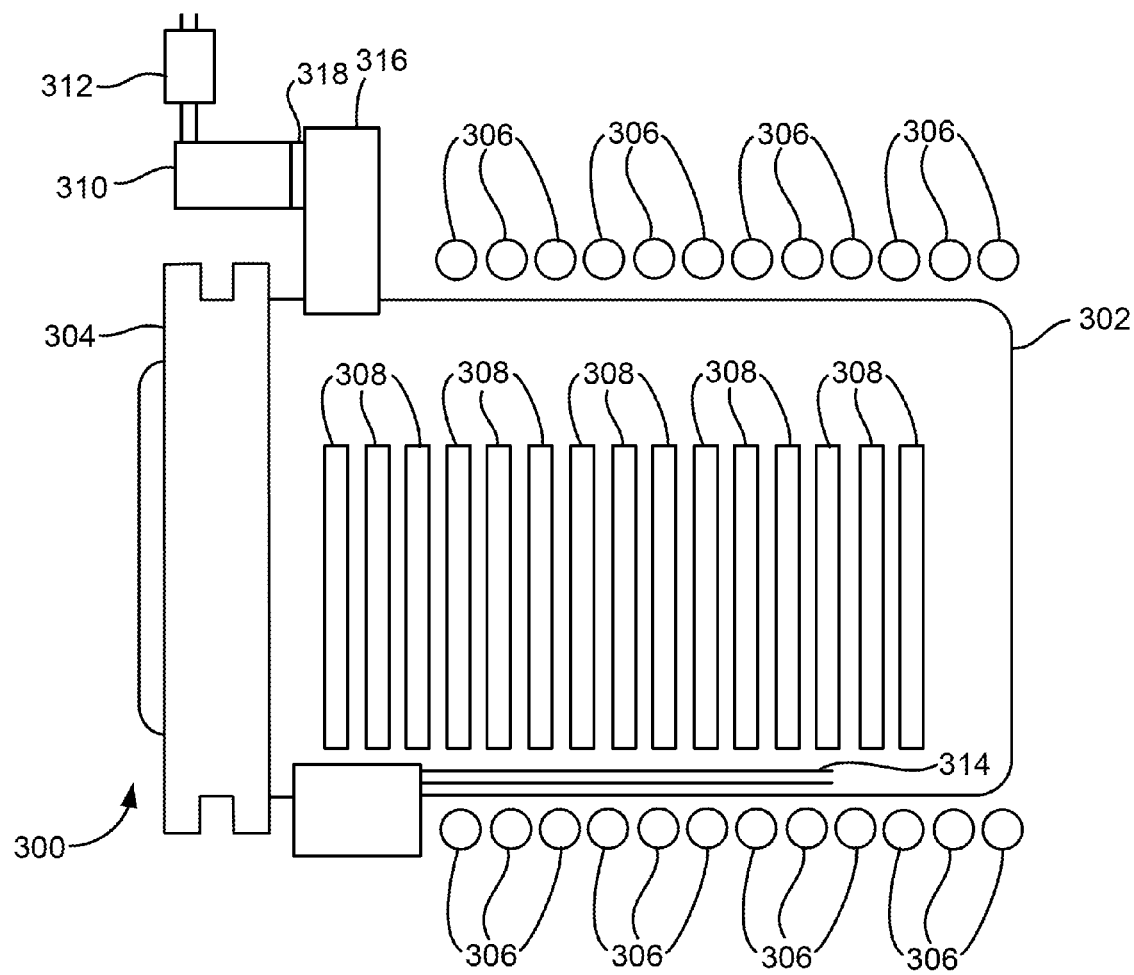
FIG. 3 is a simplified diagram of a furnace according to an embodiment of the present invention.

FIG. 3 is a simplified diagram of a furnace according to an embodiment of the present invention. This diagram is merely an example, which should not limit the scope of the claims herein. As shown, a furnace 300 includes a process chamber 302 and an end cap 304. According to an embodiment, the reaction chamber 302 is characterized by a volume of more than 200 liters. As shown in FIG. 3, the furnace 300 includes a vacuum-pumping machine that comprises a turbo molecular pump 310 and a rotary pump 312. Depending on the application, the vacuum-pumping machine can be implemented by way of a combination of a mechanical booster pump and a dry pump. For example, the raw material gas and/or a diluting gas such as helium, nitrogen, argon, or hydrogen can be introduced in process chamber 302 via a gas injection pipe 314, if demanded by the specific applications and/or processes. The chamber 302 is evacuated by the turbo molecular pump 310 via the rotary pump 312 that is connected with a manifold 316 via a gate valve and a conductance valve 318. For example, there are no special partitions in the manifold or in the reaction furnaces. A heating element 306 is mounted outside the reaction chamber 302.

In a specific embodiment, the end cap 304 of the chamber is a lid with embedded temperature control elements. For example, the lid is built with lamps for generating heat and cooling water pipes for actual temperature control. The lid also includes quartz baffles (not shown) that serves an element for controlling exchange of heat and mass (gases) between a main spatial region of the chamber 302 and a spatial region surrounding the lid. By controlling the lid temperature through the embedded elements and heat/mass flow through the baffles, the reactive chemistry in the main spatial region of the chamber, where the substrates with copper indium gallium composite film are loaded, is under controlled.

The furnace 300 can be used for many applications. According to an embodiment, the furnace 300 is used to apply thermal energy to various types of substrates and to introduce various types of gaseous species, among others. In an embodiment, one or more glass plates or substrates are positioned vertically near the center of chamber 302. As an example, substrates 308 can be similar to those described in FIGS. 2 and 2A (e.g., Cu/In layers or composite Cu/In layer overlying a metal contact layer on a substrate). These layers placed in the process chamber in the presence of a gas containing selenium, such as hydrogen selenide $H_2Se$. After annealing the material for a given period of time, the copper, indium and selenium interdiffuse and react to form a high quality copper indium diselenide (CIS) film.

Figure 4:
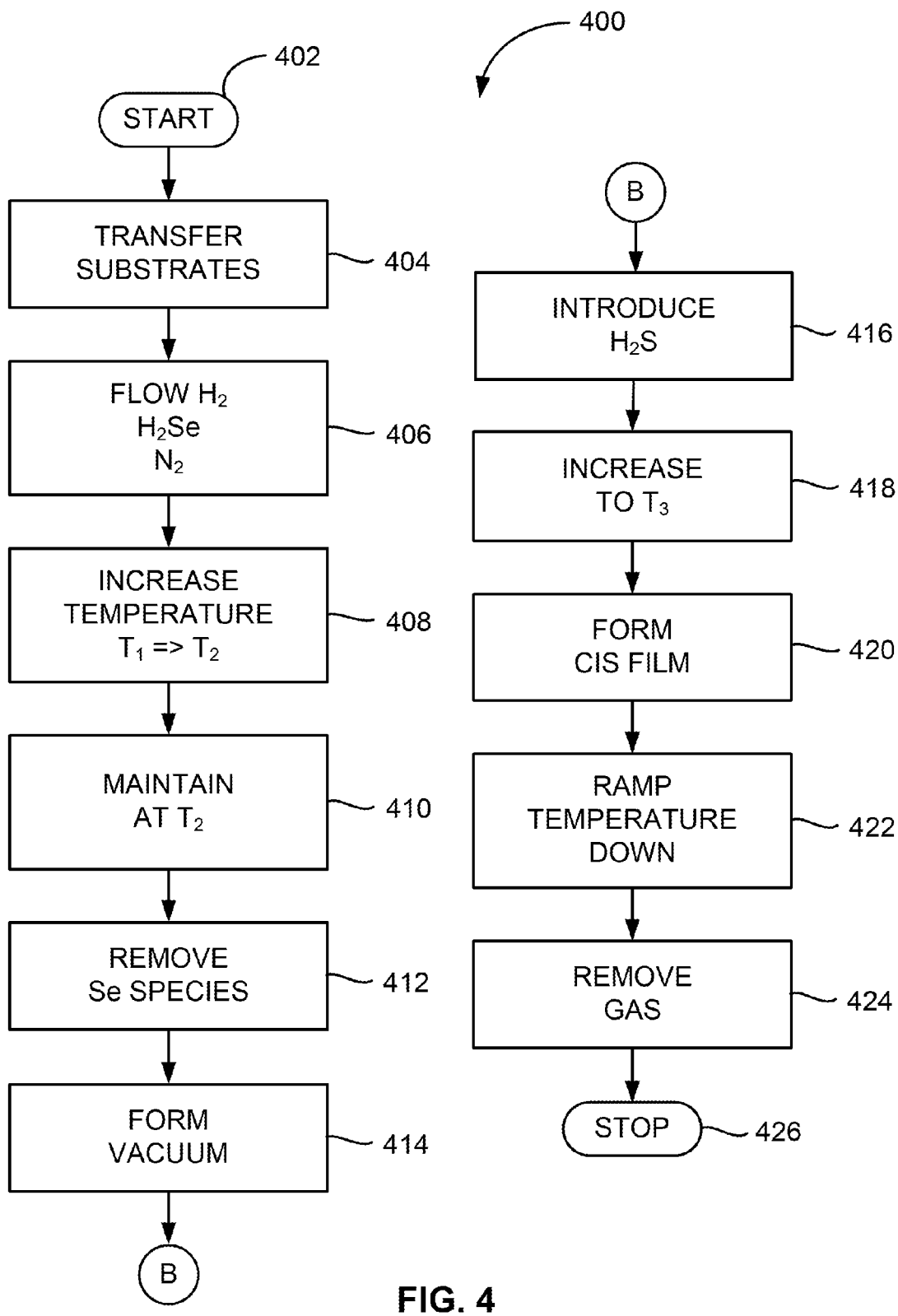
FIG. 4 is a simplified diagram of a process for forming a copper indium diselenide layer according to an embodiment of the present invention.

FIG. 4 is a simplified diagram of a process for forming a copper indium diselenide layer according to an embodiment of the present invention. This diagram is merely an example, which should not limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 4, the present method can be briefly outlined below.

1. Start;
2. Provide a plurality of substrates having a copper and indium composite structure
3. Introduce a gaseous species including a selenide species and a carrier gas into the furnace;
4. Transfer thermal energy into the furnace to increase a temperature from a first temperature to a second temperature;
5. Maintain the temperature at about the second temperature for a period of time;
6. Remove at least the residual selenide species from the furnace;
7. Form vacuum in the process chamber;
8. Introduce a sulfide species into the furnace while;
9. Increasing the temperature to a third temperature;
10. Maintain the temperature at about the third temperature for a period of time;
11. Ramp down the temperature from the third temperature to about the first temperature;
12. Remove gas; and
13. Stop.

These steps are merely examples and should not limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention. As shown, the method 400 begins at start, step 402. Here, the user of the method begins at a process chamber, such as the one noted above, as well as others. The process chamber can be maintained at about room temperature before proceeding with the present method. But the process chamber can start temperature ramping from a temperature higher than room temperature, such as 100° C.

A plurality of substrates is transferred into the process chamber, step 402. Each of the plurality of substrates can be provided in a vertical orientation with respect to gravity. The plurality of substrates can be defined by a number N, where N is greater than 5. The plurality of substrates can comprise 5 or more individual substrates. In another embodiment, the plurality of substrates can comprise 40 or more individual substrates. For example, each substrate can have a dimension of 65 cm×165 cm or smaller. But it is understood that other dimensions are possible. Each of the substrates is maintained in substantially a planar configuration free from warp or damage. For example, if the substrates were provided in an orientation other than vertical with respect to gravity, the gravitational force could cause the substrates to sag and warp unless they are placed on a supporting structure such as shelves. This occurs when the substrate material reaches a softening temperature, compromising the structural integrity of the substrate. Typically, glass substrates, particular soda lime glass substrates, begin to soften at 480° C. In an embodiment, the substrates are also separate from one another according to a predetermined spacing to ensure even heating and reactions with gaseous species that are to be introduced to the furnace.

After the substrates are positioned into the process chamber, gaseous species, including a selenide species, and/or a carrier gas, are introduced into the process chamber in step 406. In an embodiment, the gaseous species includes at least $H_2Se$ and nitrogen. In another embodiment, the gaseous species other types of chemically inert gas, such as helium, argon, etc. For example, the substrates are placed in the presence of a gas containing selenium, such as $H_2Se$.

The furnace is then heated up to a second temperature ranging from about 350° C. to 450° C. in step 408. The transfer of thermal energy for the purpose of heating the process chamber can be done by heating elements, heating coils, and the like. For example, step 408, among other things, at least starts the formation of a copper indium diselenide film by reactions between the gaseous species and the copper and indium composite (or layered) structure on each of the substrates. In a specific embodiment, separate layers of copper and indium material are diffused into each other to corm a single layer of copper indium alloy material. The second temperature is maintained for 10 to 90 minutes at the heat treatment interval between 350° C. and 450° C., step 410. In another embodiment, the second temperature range can be from 390° C. to 410° C. For example, the period of time for maintaining the temperature at step 410 is provided to allow formation of the CIS film material. As the temperature increases, the pressure inside the furnace may increase as well. In a specific embodiment, a pressure release valve is used to keep the pressure within the furnace at approximately 650 torr.

As the temperature is maintained at the second temperature (step 410) or at least when the temperature above certain threshold, the removal of the residual selenide species begins, in step 412. A vacuum is formed in the process chamber through a vacuum pump, in step 414. Once the vacuum is created in the process chamber (step 414), a sulfide species is introduced, in step 416. In a specific embodiment, the residual selenide removal process may continue until the process chamber is in vacuum configuration. After the gas ambience in the furnace has been changed such that the residual selenide species is removed and the sulfide species is introduced, a second temperature ramp up process is initiated, step 418. But, an optional step may include waiting before the temperature is ramped up to allow the temperature uniformity to improve for all substrates in the main spatial region of the chamber. In a specific embodiment, the sulfide species is introduced with nitrogen, which functions as a carrier gas occupying approximately 70 to 75% of furnace. The temperature of the furnace is increased to a third temperature ranging from about 500° C. to 525° C. For example, the third temperature is calibrated for reaction between the sulfide species and the substrates in furnace.

At step 420, temperature is maintained at the third temperature for a period of time until the formation of the copper indium diselenide CIS (or CIGS if gallium is included) layer is completed. The step is set up for the purpose of extracting out one or more selenium species from the copper indium diselenide film in the ambient of the furnace comprising the sulfur species. It is to be appreciated that a predetermined amount of selenium are removed. In a specific embodiment, approximately 5% of the selenium is removed from the CIS film and is replaced by about 5% of sulfur. According to an embodiment, a complete reaction between the selenium with the CIS film is desired. After the removal of residual selenium, a controlled temperature ramp down process is initiated, in step 422. The furnace is cooled to the first temperature of about room temperature, and the remaining gaseous species are removed from the furnace, in step 424. For example, the gaseous species are removed by a vacuum pumping machine. The temperature sequence described above can be illustrated in the temperature profile in FIG. 5.

After step 420, additional steps may be performed depending on the desired end product. For example, if a CIS or CIGS type of thin-film solar cell is desired, additional processes are provided to provide additional structures, such as a transparent layer of material such as ZnO overlaying the CIS layer.

It is also understood that the examples and embodiments described herein are for illustrative purposes only and that various modifications or changes in light thereof will be suggest to persons skilled in the art and are to be included within the spirit and purview of this application and scope of the appended claims.

Figure 5:
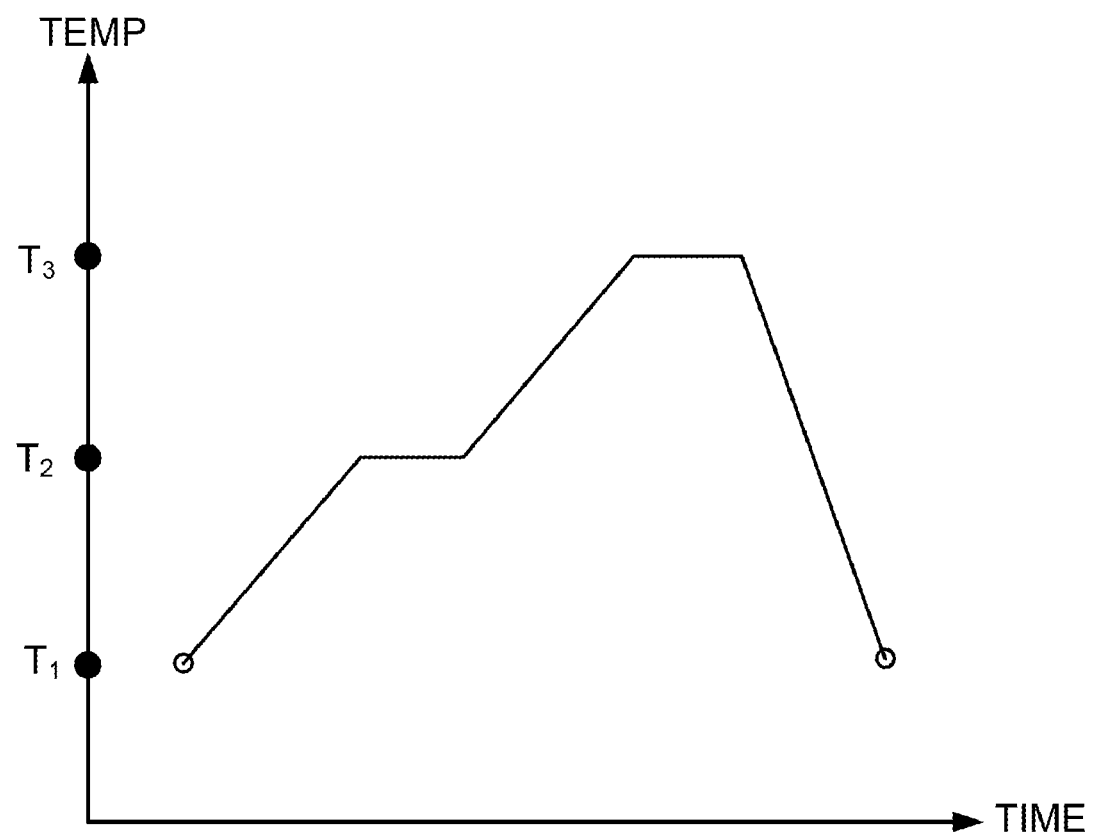
FIGS. 5 and 5A are simplified diagrams of a temperature profile of the furnace according to an embodiment of the present invention.

FIG. 5 is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5) is provided to illustrate a heating process according to an embodiment of the present invention. In an embodiment, the process chamber is configured to include independently controlled temperature zones with heater elements properly disposed near the corresponding zones. This enables the derivation of the optimized temperature profile. The optimized profile regulates the process chamber in order to prevent the warping of large substrates at high temperatures. If the temperature is ramped up too high too quickly, warping or damage may occur due to the softening of glass. In addition, the total amount of thermal energy is determined in consideration of total thermal budget available to the substrates and to maintain the uniformity and structure integrity of the glass substrate. For example, by periodically controlling the temperature of the heating process in steps, the substrate stays at a level of stabilization and relaxing in which the requisite structure integrity is maintained. As explained above, material such as glass tends to deform at a temperature of 480° C. or higher, and thus caution is exercised to avoid prolong exposure of substrate at high temperatures. Referring to FIG. 5, while the ambience of a process chamber is maintained with a gaseous species including a selenide species and a carrier gas, a plurality of substrates is put into the furnace. The plurality of substrates is provided in a vertical orientation with respect to a direction of gravity, with the plurality of substrates being defined by a number N, where N is greater than 5. In certain implementation, the number N is greater than 40. In an embodiment, the substrates include glass substrates, such as soda lime glass. The furnace starts the process with a first temperature of about 30° C. (i.e., around room temperature). The furnace of course can start with a higher temperature, such as 100° C. The furnace is then heated up to a second temperature ranging from about 350° C. to 450° C.

The second temperature is maintained for 10 to 90 minutes at the heat treatment interval between 350° C. to 450° C. The size of glass substrate can be 65 cm×165 cm or smaller. A challenge in processing large substrate is the warping of the substrate at high temperatures. If the temperature is ramped up directly to T3, warping or damage may occur. In an embodiment, all substrates are loaded in a substrate holder or boat that sets them in substantially a planar configuration free of warp or damage. In an example, each substrate is disposed in the boat in substantially vertical direction relative to gravity and has a predetermined spacing from its nearest neighbor. As shown in FIG. 5, the slope of ramping up from T2 to T3 is calibrated to reduce and/or eliminate the risk of damaging the substrate. By maintaining the temperature in the process chamber at T2 for a period of time, the substrate can relax and stabilize. The maintaining time at this interval is set up according to the purpose of at least initiating formation of the copper indium diselenide film from the copper and indium composite structure on each of the substrates.

While the second temperature is maintained, the ambient of the furnace is changed such that the selenide species is removed and a sulfide species is introduced.

After the gas ambient in the furnace has been changed such that the selenide species is removed and the sulfide species is introduced, a second temperature ramp up process is initiated. There can be a delay in the ramp of furnace temperature in order to improve substrate temperature uniformity. Then, the temperature of the furnace is increased to a third temperature ranging from about 500° C. to 525° C.

After the temperature ramp-up process, the temperature of the furnace is maintained for 10 to 60 minutes at the heat treatment interval between 500° C. and 525° C. The time interval with the temperature in a plateau in an ambient comprising a sulfur species, e.g., hydrogen sulfide gas, is set up for the purpose of extracting out one or more selenium species from the copper indium diselenide film. In particular, the residual selenide species can be thermally cranked or decomposed to elemental selenium particles, which can be carried away by a convective current from relative hot main spatial region of the chamber to a relative cold region such as the end cap region. Additionally, an exchange reaction occurs to replace sulfur species for the selenium species in the film overlaying the substrate. As explained above, a predetermined amount (e.g., 5 to 10%) of selenium can be extracted to provide a proper amount of selenium concentration within the CIS film.

After partial replacement of selenium by sulfur, a controlled temperature ramp-down process is initiated, as the furnace is then cooled to the first temperature of about room temperature. According to an embodiment, the cooling process is specifically calibrated. As a result of this process, the copper, indium, and selenium interdiffuse and react to form a high quality copper indium diselenide film.

Figure 5A:
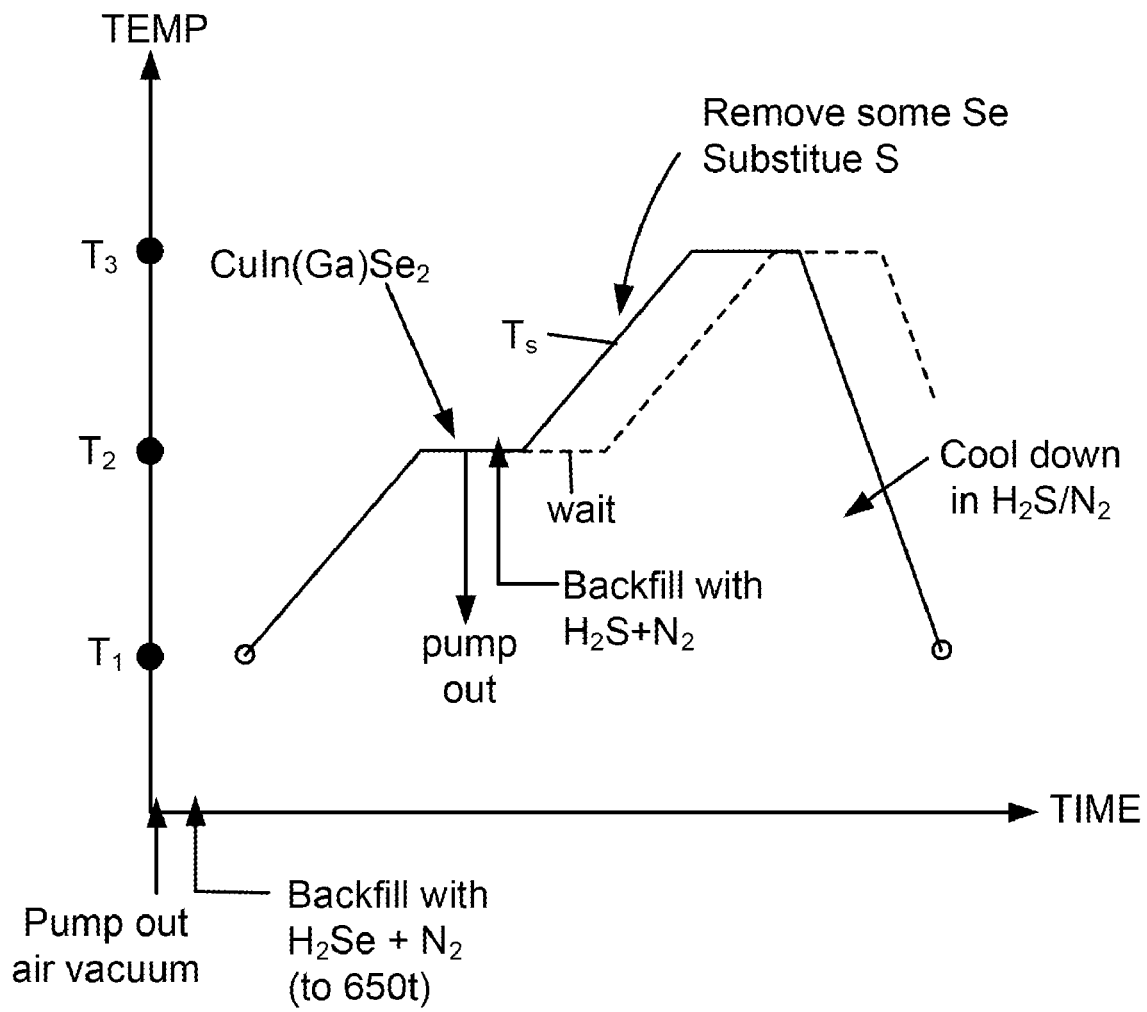

FIG. 5A is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5A) is provided to illustrate a heating process according to an embodiment of the present invention.

As shown in FIG. 5A, T1 is approximately set at room temperature. But it can be set as high as 100° C. At this temperature, substrates are loaded into a furnace. Air is pumped out (e.g., by vacuum device) from the furnace, and $H_2Se$ and $N_2$ gas species are introduced into the furnace. For example, these gas species are introduced to the furnace so that at pressure of approximate 650 torr is reached.

Next temperature increases from T1 to T2 inside the furnace. For example, the rate of temperature ramping up is optimized to allow the relative uniform reaction between selenium and copper and indium (and possibly with addition of gallium). According to embodiments, the T2 temperature is approximately between 350° C. and 450° C. For example, the furnace stays at the T2 temperature for about 10 to 60 minutes. The time staying at the T2 temperature is to allow for reaction between selenium and copper indium material. In a specific embodiment, separate layers of copper and indium material form copper indium alloy while reacting with selenium material. As shown, CIS and/or CIGS material is formed at T2. During the temperature ramping up process, the pressure inside the furnace is controlled to sustain a relative uniform pressure level of approximate 650 torr. For example, a gas escape valve is used to release gases when the furnace heat up, where pressure increases due to gas expansion at high temperature.

After the CIS or CIGS material formed, various gaseous species are again pumped out from the furnace. Then, the sulfide gas along with certain inert gases (e.g., nitrogen, argon, helium, etc.) is introduced to the furnace, and the temperature inside the furnace increases from T2 to T3. However, there can be an optional time delay in the ramp of furnace temperature in order to improve substrate temperature uniformity. For example, T3 is approximately 500° C. to 550° C. In a specific embodiment, the temperature stays at T3 to allow the sulfide gas to interact with the CIGS and/or CIS material. For example, the sulfur replaces approximately 3 to 10% of the selenium material from the CIGS and/or CIS material. After the reaction, the furnace is cools down in the ambient of sulfide gas which is removed at last.

Figure 7:
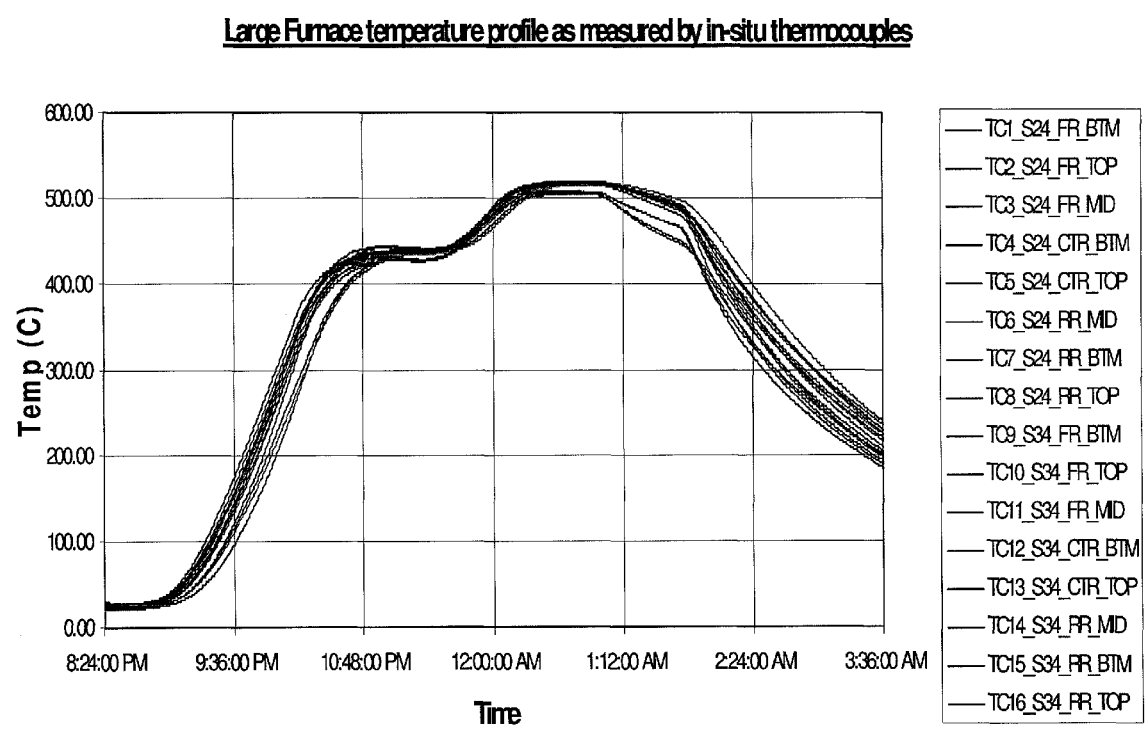
FIG. 7 shows exemplary furnace temperature profiles measured by in-situ thermal couples according to an embodiment of the present invention.

FIG. 7 shows exemplary furnace temperature profiles measured by in-situ thermal couples according to an embodiment of the present invention. This diagram is merely an example, which should not limit the scope of the claims herein. As shown, a large furnace is chosen to be the process chamber where a plurality of substrates has been loaded. Temperature sensors are pre-installed for monitoring all substrates on bottom, middle, and top regions. FIG. 7 just shows the measured temperature profile during an actual processing run. It schematically illustrates realization of the temperature profile preset in FIG. 5 or FIG. 5A. Of course there can be many variations, modifications, and alternatives.

Figure 8:
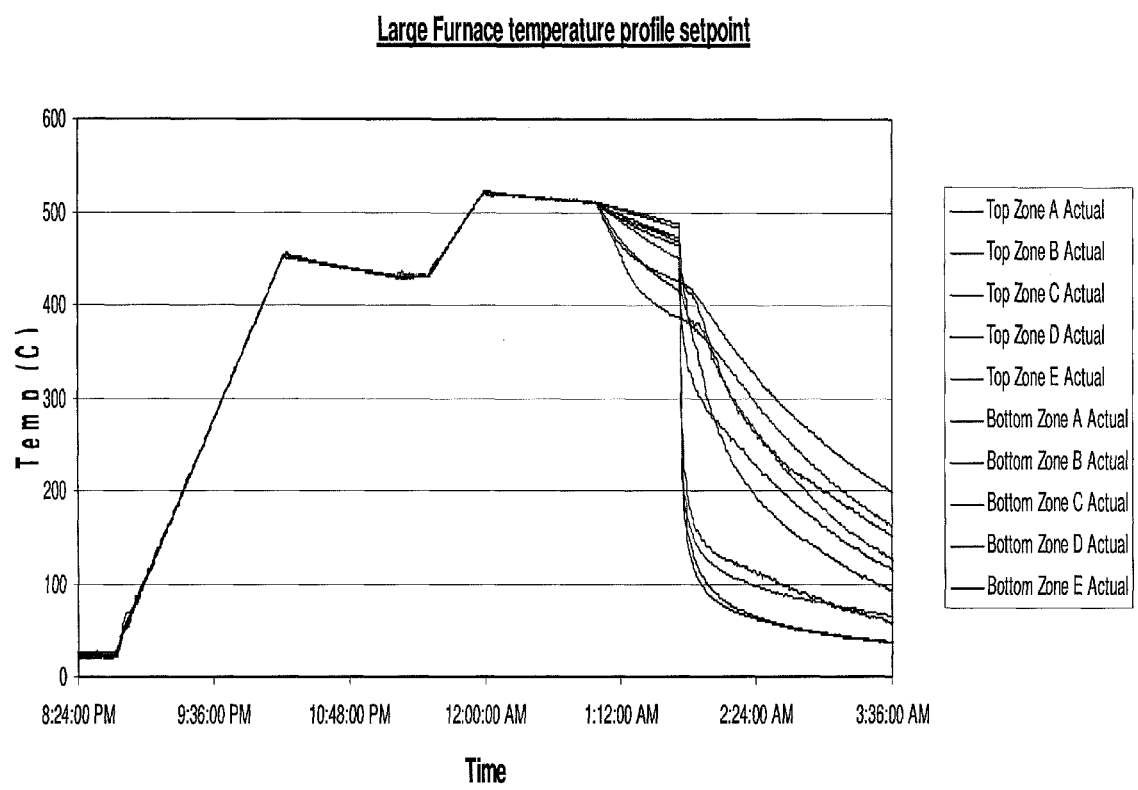
FIG. 8 shows exemplary temperature profile set points at various zones in a furnace according to an embodiment of the present invention.

In an embodiment, the furnace temperature profile, as seen in FIG. 7, is controlled by adjusting the heaters surrounding the process chamber. Additionally, depending on the internal structural design and substrate configuration when loaded in the substrate holder or boat, the temperature distribution may not be plainly uniform. In fact, several temperature zones can be identified through an experiment. Therefore, the temperature profile set point for corresponding zones can be separately controlled in order to achieve an actual temperature profile with improved uniformity. FIG. 8 just shows exemplary temperature profile set points at various zones in a furnace according to an embodiment of the present invention.

Figure 9:
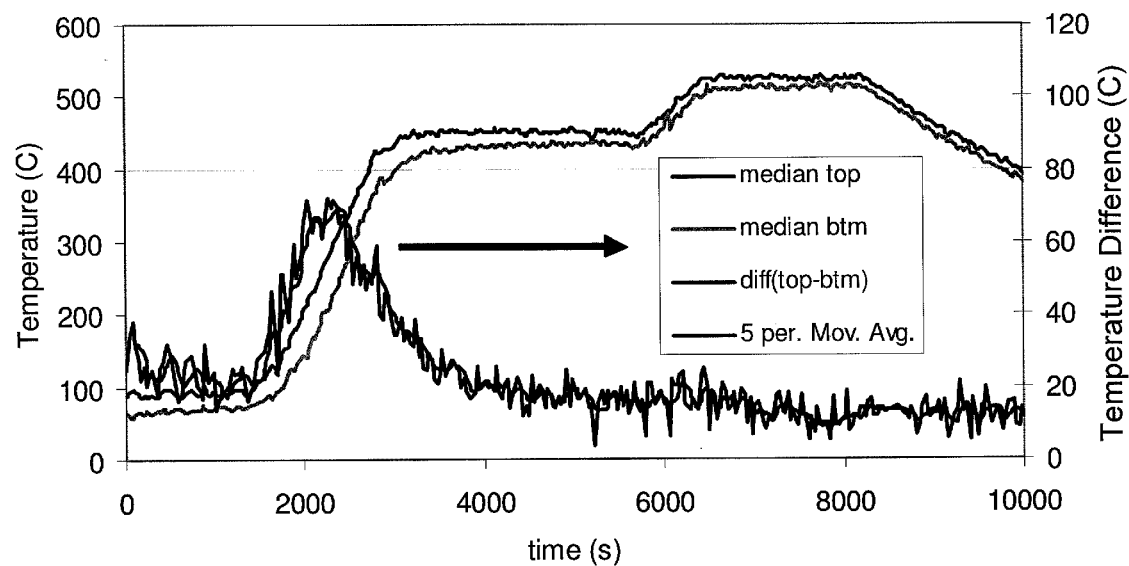
FIG. 9 shows an exemplary furnace temperature profile and substrate temperature uniformity according to an embodiment of the present invention.

For achieving desired cell performance for such large sized substrate (65 cm×165 cm), controlling the process with improved temperature uniformity is very important. As mentioned above, identifying various temperature zones in the furnace for setting independent temperature control is one method. Other methods of improving temperature uniformity include designing proper internal structural arrangement and substrate loading configuration. For example, adding certain baffles inside the furnace inner surface can partially isolate main processing zone for achieving better temperature uniformity and controlling the internal convective flow. Adding temperature control elements to an end cap (or lid) so that it can act as a "cryopump" inside the process chamber for reduce contamination and enhance chemistry control of the reactive annealing of the film on substrate. FIG. 9 shows exemplary furnace temperature profile and substrate temperature uniformity according to an embodiment of the present invention. This diagram is merely an example, which should not limit the scope of the claims herein. As shown, the temperature uniformity, described by a temperature difference from bottom to top of the substrate, can be substantially improved by adding certain structural baffle to the furnace internal surface and adjusting the substrate position in the substrate loading boat. Of course, there can be many variations, modifications, and alternatives.

Figure 6A:
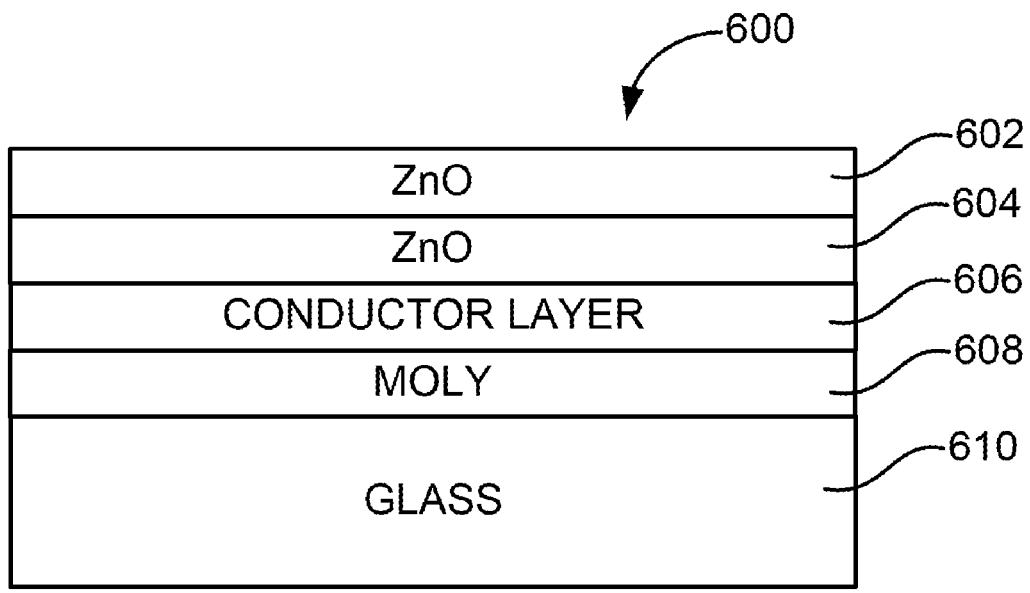
FIGS. 6A and 6B are simplified diagrams of a thin film copper indium diselenide device according to an embodiment of the present invention.
Figure 6B:
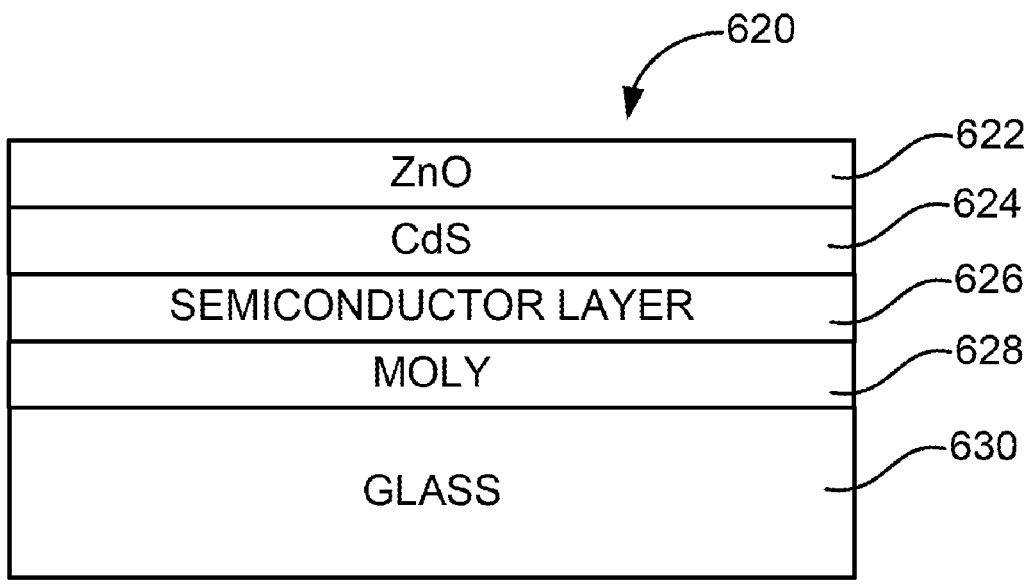

FIG. 6 is a simplified diagram of a thin film copper indium diselenide device according to an embodiment of the present invention. This diagram is merely an example, which should not limit the scope of the claims herein. As shown, structure 600 is supported on a glass substrate 610. According to an embodiment, the glass substrate comprises soda lime glass, which is about 1 to 3 millimeters thick. A back contact including a metal layer 608 is deposited upon substrate 610. According to an embodiment, layer 608 comprises primarily a film of molybdenum which has been deposited by sputtering. The first active region of the structure 600 comprises a semiconductor layer 606. In an embodiment, the semiconductor layer includes p-type copper indium diselenide (CIS) material. It is to be understood that other the semiconductor layer may include other types of material, such as CIGS, as shown. The second active portion of the structure 600 comprises layers 604 and 602 of n-type semiconductor material, such as CdS or ZnO. For example, in solar cell applications, the CdS and/or ZnO layers function as a winder layers. In FIG. 6, ZnO is shown overlaying the CdS layer. However, it should be understood that other variations are possible. In an alternative embodiments, the ZnO layer 602 overlays another ZnO layer that is characterized by a different resistivity.

A photovoltaic cell, or solar cell, such as device 600 described above, is configured as a large-area p-n junction. When photons in sunlight hit the photovoltaic cell, the photons may be reflected, pass through the transparent electrode layer, or become absorbed. The semiconductor layer absorbs the energy causing electron-hole pairs to be created. A photon needs to have greater energy than that of the band gap in order to excite an electron from the valence band into the conduction band. This allows the electrons to flow through the material to produce a current. The complementary positive charges, or holes, flow in the direction opposite of the electrons in a photovoltaic cell. A solar panel having many photovoltaic cells can convert solar energy into direct current electricity.

Semiconductors based on the copper indium diselenide (CIS) configuration are especially attractive for thin film solar cell application because of their high optical absorption coefficients and versatile optical and electrical characteristics. These characteristics can in principle be manipulated and tuned for a specific need in a given device. Selenium allows for better uniformity across the layer and so the number of recombination sites in the film are reduced which benefits the quantum efficiency and thus the conversion efficiency.

The present invention provides methods for making CIS-based and/or CIGS-based solar cells on a large glass substrate for a solar panel. The device structure described in FIG. 6 can be patterned into individual solar cells on the glass substrate and interconnected to form the solar panel. The present invention thus provides a cost-effective method for making thin film solar cell panel.

Figure 10:
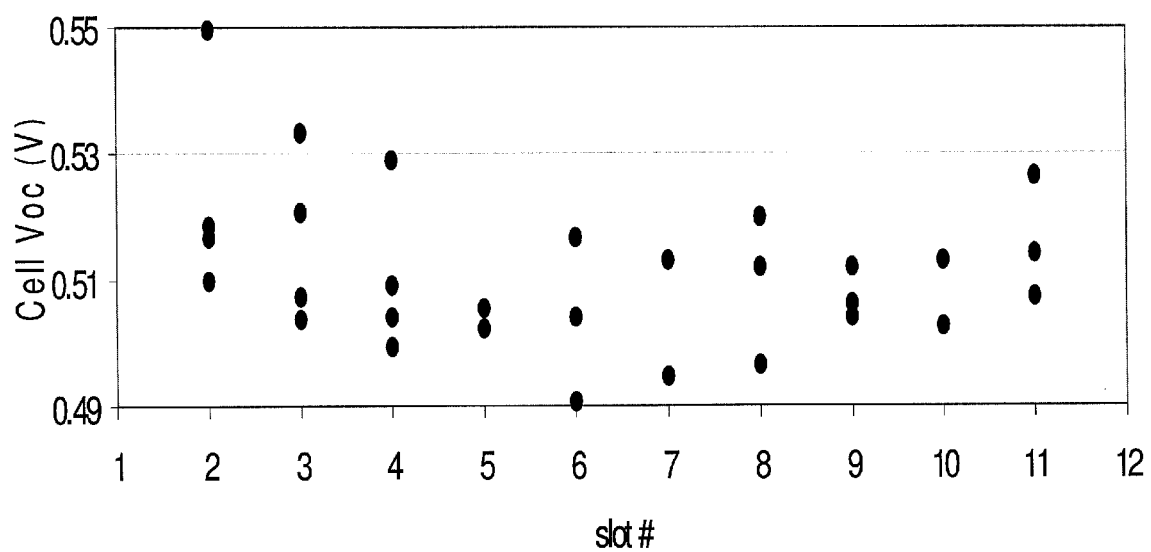
FIG. 10 shows an exemplary cell open-circuit voltage distribution from ten substrates in a furnace according to an embodiment of the present invention.

FIG. 10 shows an exemplary cell open-circuit voltage distribution from ten substrates in a furnace according to an embodiment of the present invention. This diagram is merely an example, which should not limit the scope of the claims herein. As shown, 10 soda lime glass substrates have been loaded into a furnace described before and been carried out a series of large scale selenization and sulfurization processes for forming a CIS based photovoltaic absorber film. As the results, eventually the photovoltaic cells made from these films are tested on their IV characteristics. A key parameter, cell open-circuit voltages Voc, is measured around 0.5 V for cells made from those films out of the 10 substrates. FIG. 10 just shows that the Voc value distribution has achieved desired uniformity across all substrates in this large scale production process.

It will be appreciated that all of the benefits of the present invention can be achieved regardless of the order of deposition of the copper and indium films. That is, the indium could be deposited first or the films could be deposited as a sandwich or stack of thinner layers.

It is also understood that the examples and embodiments described herein are for illustrative purposes only and that various modifications or changes in light thereof will be suggest to persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. Nos. 4,611,091 and 4,612,411, which are hereby incorporated by reference herein, without departing from the invention described by the claims herein.

What is claimed is:

1. A method for fabricating a thin film photovoltaic solar energy collector copper indium diselenide semiconductor film comprising:

providing a plurality of substrates, each of the substrates having a copper and indium composite structure;

transferring the plurality of substrates into a furnace, each of the plurality of substrates provided in a vertical orientation with respect to a direction of gravity, the plurality of substrates being defined by a number N, wherein N is greater than 5;

introducing a gaseous species including a selenide species and a carrier gas into the furnace and transferring thermal energy into the furnace to increase a temperature from a first temperature to a second temperature, the second temperature ranging from about 350° C. to about 450° C. to at least initiate formation of a copper indium diselenide film from the copper and indium composite structure on each of the substrates;

maintaining the temperature at about the second temperature for a period of time;

removing at least residual selenide species from the furnace;

introducing a sulfide species into the furnace; and increasing a temperature to a third temperature, the third temperature ranging from about 500 to 525° C. while the plurality of substrates are maintained in an environment including a sulfur species to extract out one or more selenium species from the copper indium diselenide film;

wherein the removing of residual selenide species from the furnace occurs until the furnace is in a vacuum configuration.

2. The method of claim 1 wherein the copper and indium composite structure comprises a copper layer and an indium layer of material.

3. The method of claim 1 wherein a first amount of the selenium is replaced by a second amount of sulfur at the copper indium diselenide film.

4. The method of claim 3 wherein the first amount is about 5%.

5. The method of claim 1 wherein the copper and indium composites structure forms a copper indium alloy material in the furnaces.

6. The method of claim 1 further comprising a gallium layer.

7. The method of claim 1 further comprising maintaining a substantially constant pressure of between 600 torr and 700 ton within the furnace.

8. The method of claim 1 wherein the substrates are stabilized during the period of time.

9. The method of claim 1 further comprising depositing ZnO material.

10. The method of claim 1 further comprising sputtering the copper material on the substrates.

11. The method of claim 1 further comprising evaporating the copper material on the substrates.

12. The method of claim 1 wherein the second temperature ranges from about 390° C. to about 410° C.

13. The method of claim 1 wherein the first temperature ranges from room temperature to about 100° C.

14. The method of claim 1 wherein the second temperature is maintained for about 10 to 60 minutes.

15. The method of claim 1 wherein the selenide species comprises H2Se gas.

16. The method of claim 1 wherein the carrier gas comprises nitrogen gas.

17. The method of claim 1 wherein the sulfide species comprise H2S gas.

18. The method of claim 1 wherein each of the plurality of substrates is separated by a predetermined distance.

19. The method of claim 1 wherein each of the substrates is maintained in substantially a planar configuration free from warp or damage.

20. The method of claim 1 wherein the substrates further comprises gallium material.

* * * * *